United States Patent
Liu et al.

(10) Patent No.: US 8,208,213 B2
(45) Date of Patent: Jun. 26, 2012

(54) SYSTEMS AND METHODS FOR HYBRID ALGORITHM GAIN ADAPTATION

(75) Inventors: Jingfeng Liu, Longmont, CO (US); Hongwei Song, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 213 days.

(21) Appl. No.: 12/792,555

(22) Filed: Jun. 2, 2010

(65) Prior Publication Data
US 2011/0298543 A1 Dec. 8, 2011

(51) Int. Cl.
*G11B 20/10* (2006.01)
(52) U.S. Cl. ........................................ 360/39
(58) Field of Classification Search ............... 360/39, 360/22, 31, 46, 48, 53, 61, 67; 714/701, 714/704, 758, 792, 780, 795, 755, 800; 375/136, 375/341, 298, 297, 233, 232, 345, 229; 341/120
See application file for complete search history.

(56) References Cited

U.S. PATENT DOCUMENTS

| | | | |
|---|---|---|---|
| 4,646,170 A * | 2/1987 | Kobayashi et al. ............. 360/22 |
| 4,890,298 A * | 12/1989 | Galpin ......................... 375/233 |
| 5,278,846 A | 1/1994 | Okayama et al. |
| 5,325,402 A | 6/1994 | Ushirokawa |
| 5,392,299 A | 2/1995 | Rhines et al. |
| 5,392,300 A * | 2/1995 | Borth et al. ..................... 714/758 |
| 5,471,500 A | 11/1995 | Blaker et al. |
| 5,513,192 A | 4/1996 | Janku et al. |
| 5,526,368 A * | 6/1996 | Yun ............................. 714/775 |
| 5,550,870 A | 8/1996 | Blaker et al. |
| 5,612,964 A | 3/1997 | Haraszti |
| 5,668,831 A * | 9/1997 | Claydon et al. ............... 375/232 |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |

(Continued)

FOREIGN PATENT DOCUMENTS

EP  0522578  1/1993

(Continued)

OTHER PUBLICATIONS

U.S. Appl. No. 11/461,026, filed Jul. 31, 2006, Tan, Weijun.

(Continued)

*Primary Examiner* — Fred Tzeng
(74) *Attorney, Agent, or Firm* — Hamilton, DeSanctis & Cha

(57) ABSTRACT

Various embodiments of the present invention provide systems and methods for data processing. For example, some embodiments of the present invention provide data processing circuits that include a variable gain amplifier, a gain circuit, and hybrid gain feedback combination circuit. The variable gain amplifier is operable to apply a gain to a data input corresponding to a gain feedback value and providing an amplified output. The gain circuit is operable to calculate a first algorithm error component and a second algorithm error component based at least in part on the amplified output. The hybrid gain feedback combination circuit is operable combine the first algorithm error component and the second algorithm error component to yield the gain feedback value when the data input includes a synchronization pattern.

20 Claims, 5 Drawing Sheets

U.S. PATENT DOCUMENTS

| | | | |
|---|---|---|---|
| 5,983,383 | A | 11/1999 | Wolf |
| 6,005,897 | A | 12/1999 | McCallister et al. |
| 6,014,768 | A * | 1/2000 | Lee et al. ............... 714/795 |
| 6,023,783 | A | 2/2000 | Divsalar et al. |
| 6,029,264 | A | 2/2000 | Kobayashi et al. |
| 6,041,432 | A | 3/2000 | Ikeda |
| 6,065,149 | A | 5/2000 | Yamanaka |
| 6,097,764 | A | 8/2000 | McCallister et al. |
| 6,145,110 | A | 11/2000 | Khayrallah |
| 6,216,148 | B1 * | 4/2001 | Moran et al. ............... 708/819 |
| 6,216,249 | B1 | 4/2001 | Bliss et al. |
| 6,216,251 | B1 | 4/2001 | McGinn |
| 6,229,467 | B1 | 5/2001 | Eklund et al. |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,381,726 | B1 | 4/2002 | Weng |
| 6,438,717 | B1 | 8/2002 | Butler et al. |
| 6,473,878 | B1 | 10/2002 | Wei |
| 6,476,989 | B1 | 11/2002 | Chainer et al. |
| 6,625,775 | B1 | 9/2003 | Kim |
| 6,657,803 | B1 | 12/2003 | Ling et al. |
| 6,671,404 | B1 | 12/2003 | Katawani et al. |
| 6,748,034 | B2 | 6/2004 | Hattori et al. |
| 6,757,862 | B1 | 6/2004 | Marianetti |
| 6,785,863 | B2 | 8/2004 | Blankenship et al. |
| 6,788,654 | B1 | 9/2004 | Hashimoto et al. |
| 6,810,502 | B2 | 10/2004 | Eidson |
| 6,980,382 | B2 | 12/2005 | Hirano et al. |
| 6,986,098 | B2 | 1/2006 | Poeppelman et al. |
| 7,010,051 | B2 | 3/2006 | Murayama et al. |
| 7,035,412 | B2 * | 4/2006 | Lewis ............... 380/268 |
| 7,047,474 | B2 | 5/2006 | Rhee et al. |
| 7,058,873 | B2 | 6/2006 | Song et al. |
| 7,073,118 | B2 | 7/2006 | Greenberg et al. |
| 7,093,179 | B2 | 8/2006 | Shea |
| 7,113,356 | B1 | 9/2006 | Wu |
| 7,173,783 | B1 | 2/2007 | McEwen et al. |
| 7,184,486 | B1 | 2/2007 | Wu et al. |
| 7,191,378 | B2 | 3/2007 | Eroz et al. |
| 7,203,015 | B2 | 4/2007 | Sakai et al. |
| 7,203,887 | B2 | 4/2007 | Eroz et al. |
| 7,236,757 | B2 | 6/2007 | Raghavan et al. |
| 7,257,764 | B2 | 8/2007 | Suzuki et al. |
| 7,309,931 | B2 * | 12/2007 | Hoppe ............... 310/12.29 |
| 7,310,768 | B2 | 12/2007 | Eidson et al. |
| 7,313,750 | B1 | 12/2007 | Feng et al. |
| 7,370,258 | B2 | 5/2008 | Iancu et al. |
| 7,403,752 | B2 | 7/2008 | Raghavan et al. |
| 7,430,256 | B2 | 9/2008 | Zhidkov |
| 7,502,189 | B2 | 3/2009 | Sawaguchi et al. |
| 7,505,537 | B1 | 3/2009 | Sutardja |
| 7,523,375 | B2 | 4/2009 | Spencer |
| 7,587,657 | B2 | 9/2009 | Haratsch |
| 7,590,168 | B2 | 9/2009 | Raghavan et al. |
| 7,623,600 | B2 * | 11/2009 | Momtaz et al. ............... 375/345 |
| 7,702,989 | B2 | 4/2010 | Graef et al. |
| 7,712,008 | B2 | 5/2010 | Song et al. |
| 7,782,979 | B2 * | 8/2010 | Long ............... 375/297 |
| 7,801,200 | B2 | 9/2010 | Tan |
| 7,801,208 | B2 * | 9/2010 | Hidaka ............... 375/229 |
| 7,802,163 | B2 | 9/2010 | Tan |
| 7,872,823 | B2 * | 1/2011 | Liu et al. ............... 360/39 |
| 7,873,340 | B2 * | 1/2011 | Li et al. ............... 455/234.1 |
| 2003/0063405 | A1 | 4/2003 | Jin et al. |
| 2003/0081693 | A1 | 5/2003 | Raghavan et al. |
| 2003/0087634 | A1 | 5/2003 | Raghavan et al. |
| 2003/0112896 | A1 | 6/2003 | Raghavan et al. |
| 2003/0134607 | A1 | 7/2003 | Raghavan et al. |
| 2004/0071206 | A1 | 4/2004 | Takatsu |
| 2004/0098659 | A1 | 5/2004 | Bjerke et al. |
| 2005/0010855 | A1 | 1/2005 | Lusky |
| 2005/0111540 | A1 | 5/2005 | Modrie et al. |
| 2005/0157780 | A1 | 7/2005 | Werner et al. |
| 2005/0195749 | A1 | 9/2005 | Elmasry et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0123285 | A1 | 6/2006 | De Araujo et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0248435 | A1 | 11/2006 | Haratsch |
| 2006/0256670 | A1 | 11/2006 | Park et al. |
| 2007/0011569 | A1 | 1/2007 | Casado et al. |
| 2007/0047635 | A1 | 3/2007 | Stojanovic et al. |
| 2007/0098119 | A1 * | 5/2007 | Stothers et al. ............... 375/345 |
| 2007/0110200 | A1 | 5/2007 | Mergen et al. |
| 2007/0230407 | A1 | 10/2007 | Petrie et al. |
| 2007/0286270 | A1 | 12/2007 | Huang et al. |
| 2008/0049825 | A1 | 2/2008 | Chen et al. |
| 2008/0055122 | A1 | 3/2008 | Tan |
| 2008/0065970 | A1 | 3/2008 | Tan |
| 2008/0069373 | A1 | 3/2008 | Jiang et al. |
| 2008/0168330 | A1 | 7/2008 | Graef et al. |
| 2009/0199071 | A1 | 8/2009 | Graef |
| 2009/0235116 | A1 | 9/2009 | Tan et al. |
| 2009/0235146 | A1 | 9/2009 | Tan |
| 2009/0259915 | A1 | 10/2009 | Livshitz et al. |
| 2009/0273492 | A1 | 11/2009 | Yang et al. |
| 2009/0274247 | A1 | 11/2009 | Galbraith et al. |
| 2010/0002795 | A1 | 1/2010 | Raghavan et al. |
| 2010/0061492 | A1 | 3/2010 | Noelder |
| 2010/0070837 | A1 | 3/2010 | Xu et al. |
| 2010/0164764 | A1 | 7/2010 | Nayak |
| 2010/0185914 | A1 | 7/2010 | Tan et al. |
| 2010/0188647 | A1 * | 7/2010 | Yang et al. ............... 355/72 |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/887,330, filed Sep. 21, 2010, Zhang, et al.
U.S. Appl. No. 12/887,369, filed Sep. 21, 2010, Liu et al.
U.S. Appl. No. 12/901,816, filed Oct. 11, 2010, Li et al.
U.S. Appl. No. 12/917,756, filed Nov. 2, 2010, Miladinovic et al.
U.S. Appl. No. 12/947,931, filed Nov. 17, 2010, Yang, Shaohua.
U.S. Appl. No. 12/947,947, filed Nov. 17, 2010, Ivkovic et al.
U.S. Appl. No. 12/972,942, filed Dec. 20, 2010, Liao et al.
Casado et al., Multiple-rate low- denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gunnam, K et al. "Tech. Note on Iterative LDPC Solutions for Turbo Equal.", K. Gunnam, G. Choi and M. Yeary, TX A&M Tech. Note, Rpt. Dt: Jul. 2006 Avail. online dropzone.tamu.edu.
K. Gunnam et al., "Next Generation iterative LDPC solutions for magnetic recording storage," invited paper. The Asilomar Conference on Signals, Systems, and Computers, Nov. 2008.
Han and Ryan, "Pinning Techniques for Low-Floor Detection/Decoding of LDPC-Coded Partial Response Channels", 5th International Symposium on Turbo Codes &Related Topics, 2008.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Mohsenin et al., "Split Row: A Reduced Complexity, High Throughput LDPC Decoder Architecture", pp. 1-6, printed from www.ece.ucdavis.edu on Jul. 9, 2007.

Sari H et al., "Transmission Techniques for Digital Terrestrial TV Broadcasting" IEEE Communications Magazine, IEEE Service Center Ny, NY vol. 33, No. 2 Feb. 1995.

Unk, "Auto threshold and Auto Local Threshold" [online] [retr. May 28, 2010] Retr. from the Internet www.dentristy.bham.ac.uk/landinig/software/autothreshold/autothreshold.html.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Wang Y et al., "A Soft Decision Decoding Scheme for Wireless COFDM With App. to DVB-T" IEEE Transactions on Consumer elect., IEEE Service Center, NY,NY vo. 50, No. 1 Feb. 2004.

Weon-Cheol L. et al., "Vitierbi Decoding Method Using Channel State Information in COFDM System" IEEE Trans. on Consumer Elect., IEEE Service Center, NY, NY vol. 45 No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Youn, "BER Perf. Due to Irreg. of Row-Weoght Distr. of the Parity-Check Matirx in Irregular LDPC Codes for 10-Gb/s Optical Signals" Journal of Lightwave Tech., vol. 23 Sep. 9, 2005.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. On Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC Techron, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

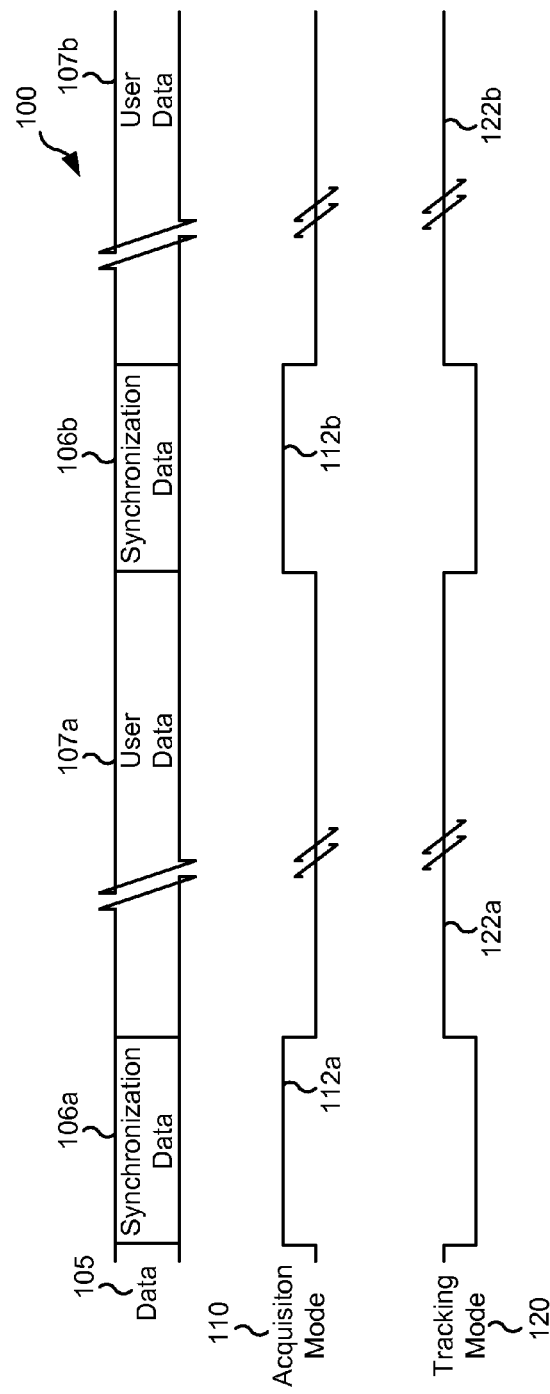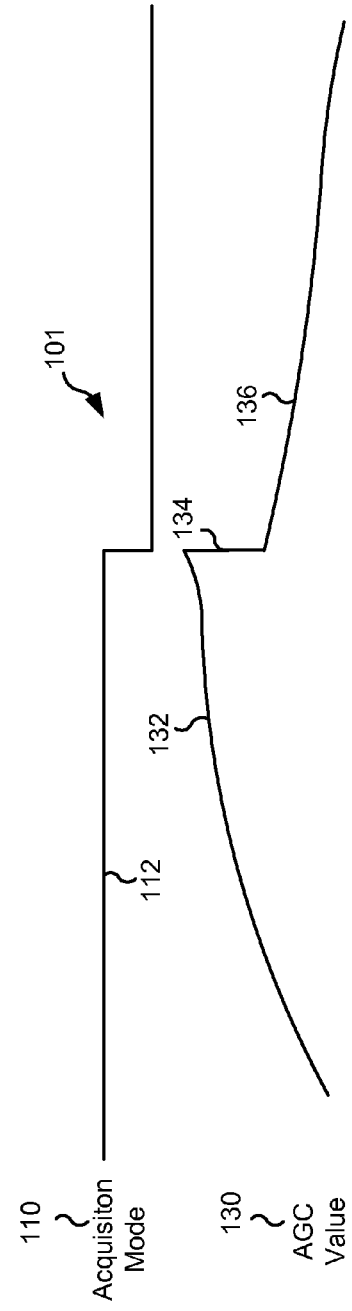
Fig. 1a (Prior Art)
Fig. 1b (Prior Art)

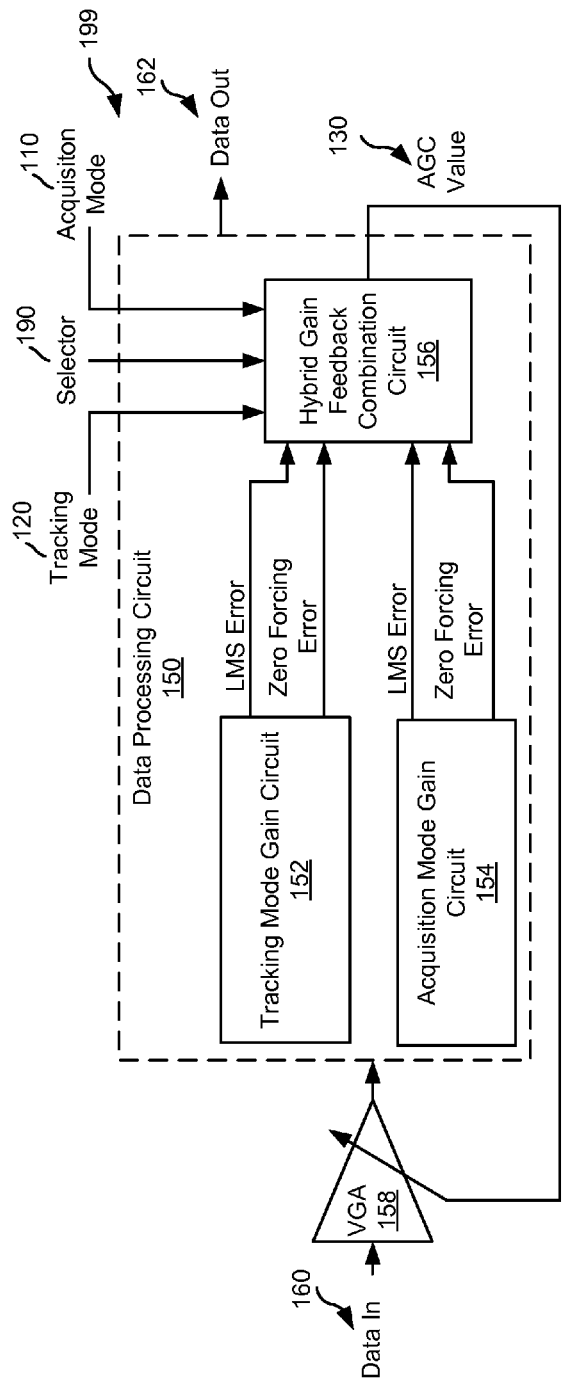
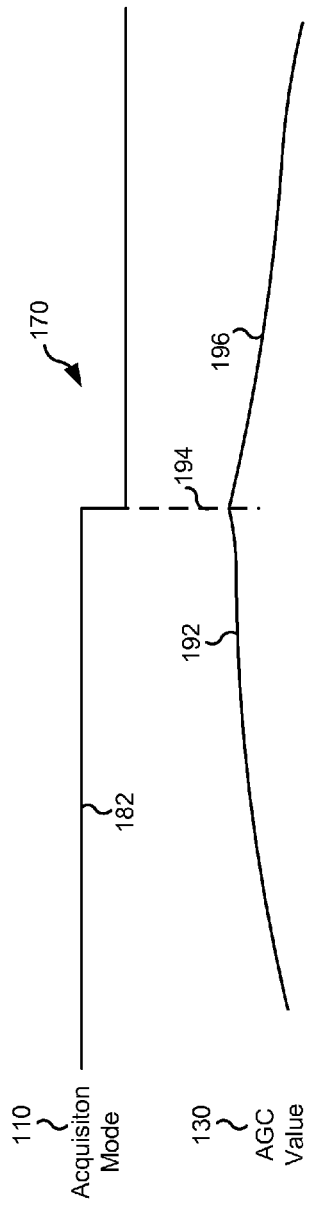
Fig. 1c
Fig. 1d

SYSTEMS AND METHODS FOR HYBRID ALGORITHM GAIN ADAPTATION

BACKGROUND OF THE INVENTION

The present inventions are related to systems and methods for data processing, and more particularly to systems and methods for determining gain in a data processing system.

A typical storage device includes a magnetic storage medium storing information that is magnetically represented on the storage medium. A head is disposed in relation to the storage medium that senses the magnetically represented information and provides an electrical signal corresponding to the magnetically represented information. This electrical signal is ultimately passed to a data detection circuit that performs one or more data detection processes in order to recover the information originally written to the storage medium. The information maintained on the storage medium typically includes both user data and synchronization data. The user data may be considered a random pattern, while the synchronization data is generally a defined pattern that may be used to synchronize to the phase of the data on the storage medium, and to set an appropriate gain to be applied to data retrieved from the storage medium. Data transfer systems often use a similar approach of transferring data that transfers what may be considered random regions of user data interspersed with synchronization data. Again, the synchronization data is generally a defined pattern that may be used to synchronize to the phase of the data on the storage medium, and to set an appropriate gain to be applied to data retrieved from the storage medium. Due to its predictability, the synchronization data may be more efficiently processed using one type of processing algorithm and the random data may be more efficiently processed using another type of algorithm. In some cases, using such distinct algorithms results in reduced data processing performance.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for determining gain in a data processing system.

Various embodiments of the present invention provide data processing circuits that include a variable gain amplifier, a gain circuit, and hybrid gain feedback combination circuit. The variable gain amplifier is operable to apply a gain to a data input corresponding to a gain feedback value and providing an amplified output. The gain circuit is operable to calculate a first algorithm error component and a second algorithm error component based at least in part on the amplified output. The hybrid gain feedback combination circuit is operable combine the first algorithm error component and the second algorithm error component to yield the gain feedback value when the data input includes a synchronization pattern.

In some instances, the first algorithm error component is a zero forcing error value, and the second algorithm error component is a least mean squared error component. In one of more instances, the gain circuit is operable to determine a peak value of the amplified output, and to calculate a difference between the peak value of the amplified output and an expected value of the amplified output to yield an interim value. Calculating the zero forcing error value may be done by multiplying the interim value by the expected value of the amplified output. Calculating the least mean squared error value may be done by multiplying the interim value by the peak value of the amplified output.

In various instances, the hybrid gain feedback combination circuit is operable to add the first algorithm error component multiplied by a first weighting factor to the second algorithm error component multiplied by a second weighting factor. In some such instances, the first weighting factor is the same as the second weighting factor. In other such instances, the first weighting factor is distinct from the second weighting factor. In one or more cases, the one or the other of first weighting factor or the second weighting factor is zero.

In some instances, the gain circuit is a first gain circuit, and the data processing circuit further includes a second gain circuit operable to calculate a third algorithm error component and a fourth algorithm error component based at least in part on the amplified output. In such instances, the hybrid gain feedback combination circuit is operable combine the third algorithm error component and the fourth algorithm error component to yield the gain feedback value when the data input includes a user data pattern. In some cases, the first algorithm error component is a first zero forcing error value, the second algorithm error component is a first least mean squared error component, the third algorithm error component is a second zero forcing error value, and the fourth algorithm error component is a second least mean squared error component. In some such cases, the hybrid gain feedback combination circuit is operable to add the first algorithm error component multiplied by a first weighting factor to the second algorithm error component multiplied by a second weighting factor when the data input includes the synchronization pattern; and the hybrid gain feedback combination circuit is operable to add the third algorithm error component multiplied by the first weighting factor to the fourth algorithm error component multiplied by the second weighting factor when the data input includes a user data pattern.

Other embodiments of the present invention provide electronic devices that include a variable gain amplifier, a first gain circuit, a second gain circuit, and a hybrid gain feedback combination circuit. The variable gain amplifier is operable to apply a gain to a data input corresponding to a gain feedback value and providing an amplified output. The first gain circuit operable to calculate a first algorithm error component and a second algorithm error component based at least in part on the amplified output, and the second gain circuit operable to calculate a third algorithm error component and a fourth algorithm error component based at least in part on the amplified output. The hybrid gain feedback combination circuit is operable combine the first algorithm error component and the second algorithm error component to yield a gain feedback value when the data input includes a synchronization pattern, and to combine the third algorithm error component and the fourth algorithm error component to yield the gain feedback value when the data input includes a user data pattern.

Yet other embodiments of the present invention provide methods for performing variable gain amplification in a data processing system. Such methods include: receiving a data input exhibiting a synchronization pattern; applying a variable gain amplification to the data input to yield an amplified output governed at least in part by the gain feedback; calculating a zero forcing error value and a second algorithm error value corresponding to the amplified output; and calculating the gain feedback based on a hybrid combination of the zero forcing error value and the least mean squared error value. In some cases, the methods further include: determining a peak value of the amplified output and calculating a difference between the peak value of the amplified output and an expected value of the amplified output. In such instances, calculating the zero forcing error value includes multiplying the peak value by the difference, and calculating the least mean squared error value includes multiplying the expected value by the difference. In various cases, the methods further include determining a combination basis using a programmed input; and selecting the hybrid combination of the zero forcing error value and the least mean squared error value to calculate a gain feedback based at least in part on the combination basis.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1a is a timing diagram showing a data set including synchronization data and user data with corresponding acquisition mode and tracking mode signals that may be processed using circuits and processes in accordance with various embodiments of the present invention;

FIG. 1b is a timing diagram showing a discontinuity occurring where distinct gain algorithms are employed between the acquisition mode and the tracking mode;

FIG. 1c depicts a data processing system including a data processing circuit that includes a tracking mode gain circuit, an acquisition mode gain circuit and a hybrid gain feedback combination circuit in accordance with some embodiments of the present invention;

FIG. 1d is a timing diagram showing a substantially smooth transition between the acquisition mode and the tracking mode where hybrid algorithm gain adaptation in accordance with one or more embodiments of the present invention is applied;

DETAILED DESCRIPTION OF THE INVENTION

Figure 2:
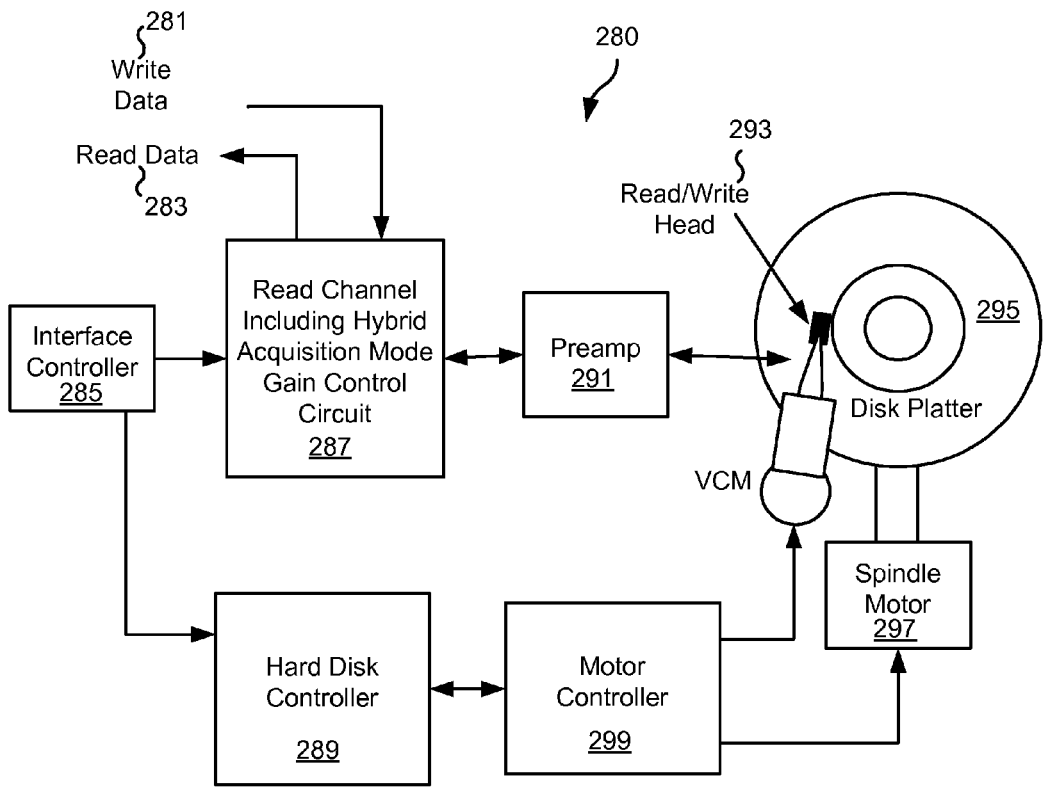
FIG. 2 depicts a storage device including a hybrid acquisition mode gain control circuit in accordance with some embodiments of the present invention.

The present inventions are related to systems and methods for data processing, and more particularly to systems and methods for determining gain in a data processing system.

Some embodiments of the present invention employ a hybrid gain control circuit that allows for mixing the output of multiple gain determination algorithms to yield a composite gain value. As one of various advantages, such an approach may be used to reduce or eliminate discontinuities resulting from the transition between an algorithm tailored for processing synchronization information and an algorithm tailored for processing interspersed user data. In one particular embodiment of the present invention, the hybrid gain control circuit allows for selecting a combination of Least Mean Square (LMS) error criteria and Zero Forcing (ZF) error criteria. In some cases, the aforementioned selection is based at least in part on an energy value. In one particular case, the energy value is calculated based on user provided target taps.

Turning to FIG. 1a, a timing diagram 100 shows a data set 105 including a series of synchronization data 106 and user data 107. The data set may be received from a variety of sources including, but not limited to, a storage medium such as a hard disk drive or a transfer medium. Based upon the disclosure provided herein, one of ordinary skill in the art will recognize a variety of sources of data set 105. As shown, an acquisition mode signal 110 is asserted high during periods 112 that correspond to synchronization data 106, and a tracking mode signal 120 that is asserted high during periods 122 that correspond to user data 107.

Turning to FIG. 1b, a timing diagram 101 shows a discontinuity 134 occurring where distinct gain algorithms are employed between acquisition mode 112 and tracking mode 122. In this case, one gain algorithm is used to determine the gain of a variable gain circuit while the circuit is operating in acquisition mode 112. As data set 105 transitions from synchronization data 106 to user data 107, the algorithm used to determine an adapting automatic gain control (AGC) value 130 switches. When this occurs, a AGC value 132 adapted during processing of synchronization data 106 immediately switches to an AGC value 136 that is adapted during processing of user data 107. This immediate switch due to a change in algorithms results in a discontinuity 134 that can affect the performance of any ongoing data processing.

Turning to FIG. 1c, a data processing system including a data processing circuit 150 that includes a tracking mode gain circuit 152, an acquisition mode gain circuit 154, a hybrid gain feedback combination circuit 156, and a variable gain amplifier 158 is depicted in accordance with some embodiments of the present invention. Data processing circuit 150 provides a data output 162 and AGC value 130 to variable gain amplifier 158. AGC value 130 is a hybrid of an LMS error component and a zero forcing error component. The LMS error component and the zero forcing error component provided from tracking mode gain circuit 152 are used by hybrid gain feedback combination circuit 156 when data processing circuit is operating in the tracking mode (i.e., while user data 107 is being received and tracking mode signal 120 is asserted high). In contrast, the LMS error component and the zero forcing error component provided from acquisition mode gain circuit 154 are used by hybrid gain feedback combination circuit 156 when data processing circuit is operating in the acquisition mode (i.e., while synchronization data 106 is being received and acquisition mode signal 110 is asserted high). The common combination is selected based on a selector value 190. Selector value 190 may be user programmable. In some cases, selector value 190 may be calculated based on target taps used in a data detector circuit (not shown) that is included as part of data processing circuit 150.

In some embodiments, the portion of data processing circuit providing the LMS error component and the zero forcing error component from tracking mode gain circuit 152 may be implemented using circuitry disclosed in U.S. patent application Ser. No. 12/352,540 entitled "AGC Loop with Weighted Zero Forcing and LMS Error Sources and Methods for Using Such" and filed Jan. 9, 2009 by Liu et al. The entirety of the aforementioned reference is incorporated herein by reference for all purposes. The portion of data processing circuit providing the LMS error component and the zero forcing error component from tracking mode gain circuit 152 may be implemented using circuitry disclosed below in relation to FIG. 4. By combining the LMS error component and the zero forcing error component associated with the tracking mode and the acquisition mode using a common combination algorithm provides a gain value controlling variable gain amplifier 158 that does not have a significant discontinuity exhibited during the transition between the acquisition mode and the tracking mode such as that depicted in FIG. 1*d*. In some cases, the aforementioned combination is based at least in part on an energy value. In one particular case, the energy value is calculated based on user provided target taps or adapted target taps. An example of such adapted target taps is provided in PCT Pat. App. PCT/US09/30639 entitled "Systems and Methods for Adaptive Target Search" and filed Jan. 9, 2009 by Liu et al. The entirety of the aforementioned reference is incorporated herein by reference for all purposes.

As one example, hybrid gain feedback combination circuit 156 may provide AGC value 130 in accordance with the following pseudo-code:

```
If(Tracking Mode = TRUE)
{
    If (Selector Value 190 >= ValueA)
    {
        AGC Value 130 = Least Mean Square Error from Tracking
        Mode Gain Circuit 152
    }
    Else If (Selector Value 190 < ValueA && Selector
    Value 190 >= ValueB)
    {
        AGC Value 130 = (1/4)(Zero Forcing Error) + (3/4)
        ( Least Mean Square Error) from
        Tracking Mode Gain Circuit 152
    }
    Else If (Selector Value 190 < ValueB && Selector
    Value 190 >= ValueC)
    {
        AGC Value 130 = (1/2)(Zero Forcing Error) + (1/2)
        ( Least Mean Square Error) from Tracking Mode
        Gain Circuit 152
    }
    Else If (Selector Value 190 < ValueC && Selector
    Value 190 >= ValueD)
    {
        AGC Value 130 = (3/4)(Zero Forcing Error) + (1/4)
        ( Least Mean Square Error) from
        Tracking Mode Gain Circuit 152
    }
    Else
    {
        AGC Value 130 = Zero Forcing Error from Tracking
        Mode Gain Circuit 152
    }
}
Else
{
    If (Selector Value 190 >= ValueA)
    {
        AGC Value 130 = Least Mean Square Error from Acquisiton
        Mode Gain Circuit 154
    }
    Else If (Selector Value 190 < ValueA && Selector
    Value 190 >= ValueB)
    {
        AGC Value 130 = (1/4)(Zero Forcing Error) + (3/4)
        ( Least Mean Square Error) from Acquisiton Mode
        Gain Circuit 154
    }
    Else If (Selector Value 190 < ValueB && Selector
```

-continued

```
    Value 190 >= ValueC)
    {
        AGC Value 130 = (1/2)(Zero Forcing Error) + (1/2)
        ( Least Mean Square Error) from Acquisiton Mode
        Gain Circuit 1542
    }
    Else If (Selector Value 190 < ValueC && Selector
    Value 190 >= ValueD)
    {
        AGC Value 130 = (3/4)(Zero Forcing Error) + (1/4)
        ( Least Mean Square Error) from Acquisiton Mode
        Gain Circuit 154
    }
    Else
    {
        AGC Value 130 = Zero Forcing Error from Acquisiton
        Mode Gain Circuit 154
    }
}
```

In one particular embodiment of the present invention, ValueA is six (6), ValueB is five (5), ValueC is four (4), and ValueD is three (3). Based upon the disclosure provided herein, one of ordinary skill in the art will recognize other hybrid combinations of Zero Forcing Error and Least Mean Square Error components and/or values (i.e., ValueA, ValueB, ValueC or ValueD) that may be used in relation to different embodiments of the present invention.

Turning to FIG. 1*d*, a timing diagram 170 shows a substantially smooth transition between acquisition mode 112 and tracking mode 122 where a hybrid algorithm gain adaptation is used across both modes in accordance with one or more embodiments of the present invention. As shown, the hybrid algorithm gain adaptation yields an increasing AGC value 192 while synchronization data 106 is being processed followed by a decreasing AGC value 196 while user data 107 is being processed. A relatively smooth transition between values 192 and 196 occurs at a transition point 194 corresponding to the switch between acquisition mode 112 and tracking mode 122. Such a smooth transition reduces or eliminates performance degradation resulting from discontinuities.

Turning to FIG. 2, a storage device 280 including a read channel 287 with a hybrid acquisition mode gain control circuit is depicted in accordance with some embodiments of the present invention. Storage device 280 may be, for example, a hard disk drive that holds user data that is separated by synchronization information. The user data may be random in nature, whereas the synchronization data is defined. The incorporated hybrid acquisition mode gain control circuit is capable of mixing the output of multiple gain determination algorithms to yield a composite gain value. In one particular embodiment of the present invention, the incorporated hybrid acquisition mode gain control circuit allows for selecting a combination of Least Mean Square (LMS) error criteria and Zero Forcing (ZF) error criteria. In some cases, the aforementioned selection is based at least in part on an energy value. In one particular case, the energy value is calculated based on user provided target taps. In some cases, the incorporated hybrid acquisition mode gain control circuit is implemented similar to that described below in relation to FIG. 4. In various cases, the hybrid acquisition mode gain control circuit is also augmented to include a hybrid tracking mode gain control circuit using a common combination algorithm as discussed above in relation to FIG. 1*c*. In various cases, the incorporated hybrid acquisition mode gain control circuit operates consistent with the method described below in relation to FIG. 5.

In addition, storage device 280 includes an interface controller 285, a hard disk controller 289, a motor controller 299, and a spindle motor 297. Interface controller 285 controls addressing and timing of data to/from disk platter 295. The data on disk platter 295 consists of groups of magnetic signals that may be detected by read/write head assembly 293 when the assembly is properly positioned over disk platter 295. The data signals are typically arranged in sectors and tracks as is known in the art. In a typical read operation, read/write head assembly 293 is accurately positioned by motor controller 299 over a desired data track on disk platter 295. Motor controller 299 both positions read/write head assembly 293 in relation to disk platter 295 and drives spindle motor 297 by moving read/write head assembly to the proper data track on disk platter 295 under the direction of hard disk controller 289. Spindle motor 297 spins disk platter 295 at a determined spin rate (RPMs).

Once read/write head assembly 293 is positioned adjacent the proper data track, magnetic signals representing data on disk platter 295 are sensed by read/write head assembly 293 as disk platter 295 is rotated by spindle motor 297. The sensed magnetic signals are provided as a continuous, minute analog signal representative of the magnetic data on disk platter 295. This minute analog signal is transferred from read/write head assembly 293 to read channel 287. Read channel 287 performs a data detection process directed at retrieving the original data. This data detection process relies on data that is processed through a variable gain amplifier with a gain control determined by the incorporated hybrid acquisition mode gain control circuit. A write operation is substantially the opposite of the preceding read operation with write data 281 being provided to read channel module 287. This data is then encoded and written to disk platter 295.

Figure 3:
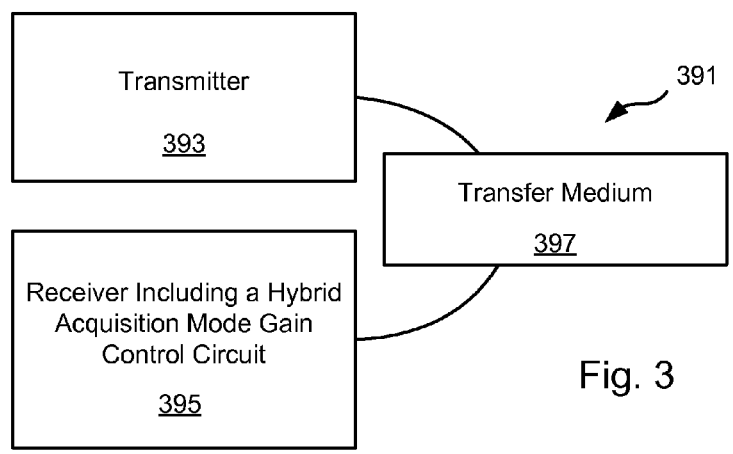
FIG. 3 shows a transmission system having a receiver with a hybrid acquisition mode gain control circuit in accordance with one or more embodiments of the present invention.

Turning to FIG. 3, a communication system 391 including a receiver 395 with a hybrid acquisition mode gain control circuit in accordance with some embodiments of the present invention is shown. Communication system 391 includes a transmitter 393 that is operable to transmit information via a transfer medium 397 as is known in the art. The transmitted information includes user data that is separated by synchronization information. The user data may be random in nature, whereas the synchronization data is defined. The data is received from transfer medium 397 by receiver 395.

The a hybrid acquisition mode gain control circuit incorporated in receiver 395 is capable of mixing the output of multiple gain determination algorithms to yield a composite gain value. In one particular embodiment of the present invention, the incorporated hybrid acquisition mode gain control circuit allows for selecting a combination of Least Mean Square (LMS) error criteria and Zero Forcing (ZF) error criteria. In some cases, the aforementioned selection is based at least in part on an energy value. In one particular case, the energy value is calculated based on user provided target taps. In some cases, the incorporated hybrid acquisition mode gain control circuit is implemented similar to that described below in relation to FIG. 4. In various cases, the incorporated hybrid acquisition mode gain control circuit operates consistent with the method described below in relation to FIG. 5. As data it received via transfer medium 397, receiver 395 applies a variable gain to the received information with the variable gain being based upon an output from the incorporated hybrid acquisition mode gain control circuit. This amplified data is then processed using a data processing circuit to yield the data originally provide to transmitter 393.

It should be noted that transfer medium 397 may be any medium whereby information is transferred including, but not limited to, a wired interface, an optical interface, a wireless interface, and/or combinations thereof. Based on the disclosure provided herein, one of ordinary skill in the art will recognize a variety of mediums that may include defects and that may be utilized in relation to different embodiments of the present invention.

Figure 4:
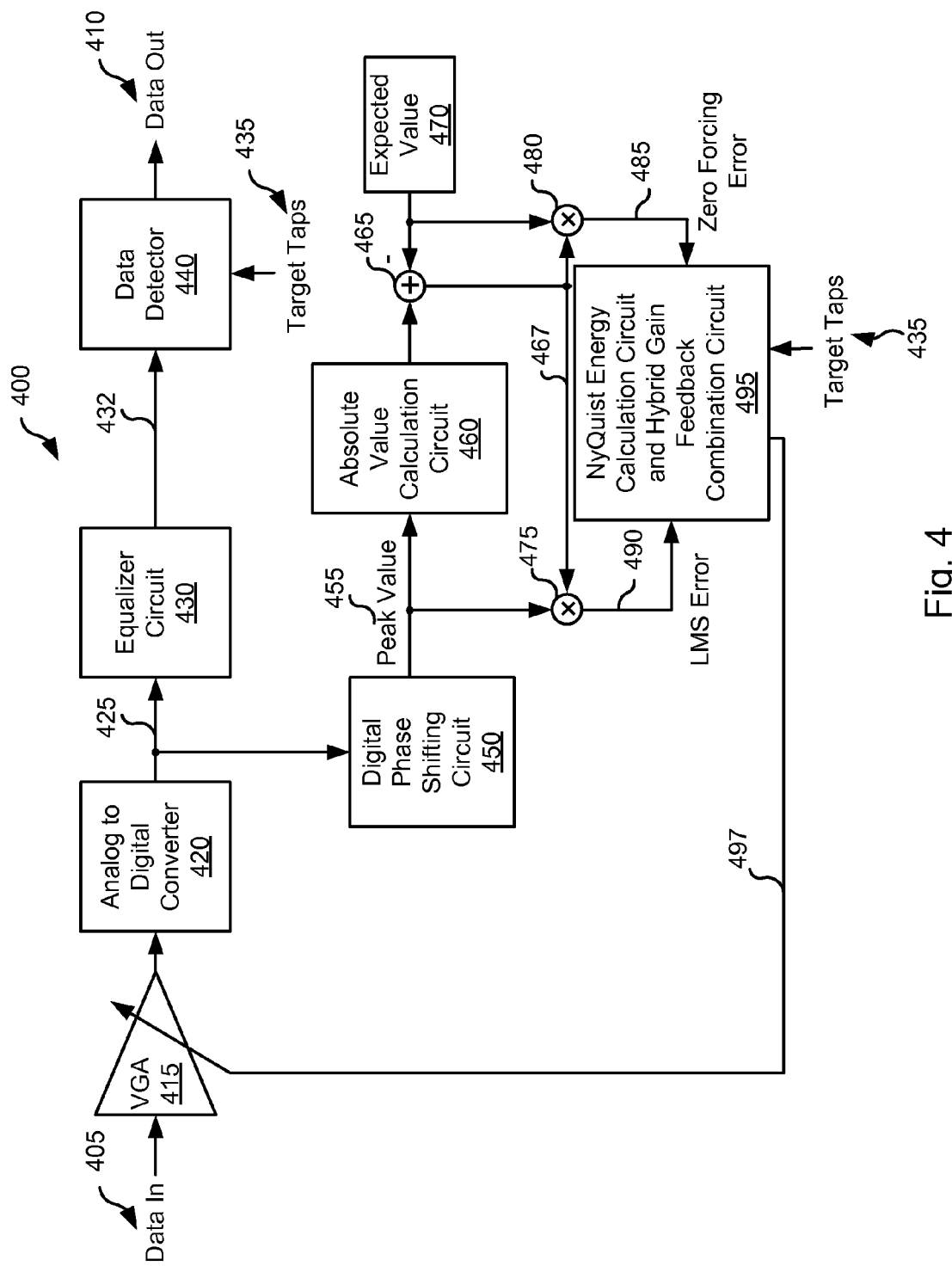
FIG. 4 depicts a variable gain input circuit in accordance with various embodiments of the present invention.

Turning to FIG. 4, a variable gain input circuit 400 is shown in accordance with one or more embodiments of the present invention. Variable gain input circuit 400 is operable to process data sets including both synchronization data and user data. Such synchronization data may be, for example, a predefined periodic pattern, and the user data may be, for example, a series of user data bits that may be treated as random data for data processing purposes. In some embodiments of the present invention, the synchronization pattern is a periodic pattern such as, for example, a 2T pattern (i.e., '001100110011 . . . ') that is designed to indicate the phase and the frequency of the subsequent user data. Based upon the disclosure provided herein, one of ordinary skill in the art will recognize a variety of synchronization data patterns that may be used in relation to different embodiments of the present invention.

Variable gain input circuit 400 applies a variable gain amplification to an analog input embodying the received data sets prior to performing an analog to digital conversion on the analog input. The gain value controlling the variable gain amplification is calculated using a hybrid gain control circuit that allows for mixing the output of multiple gain determination algorithms to yield a composite gain value. As one of various advantages, such an approach may be used to reduce or eliminate discontinuities resulting from the transition between an algorithm tailored for processing synchronization information and an algorithm tailored for processing interspersed user data. In one particular embodiment of the present invention, the hybrid gain control circuit allows for selecting a combination of Least Mean Square (LMS) error criteria and Zero Forcing (ZF) error criteria. In some cases, the aforementioned selection is based at least in part on an energy value. In one particular case, the energy value is calculated based on user provided target taps.

Variable gain input circuit 400 includes a variable gain amplifier circuit 415 that receives an analog data input 405. Data input 405 may be derived from a number of sources including, but not limited, a storage medium or a transfer medium. Based upon the disclosure provided herein, one of ordinary skill in the art will recognize other sources from which data input 405 may be derived. Variable gain amplifier circuit 415 may be any amplifier circuit known in the art that is capable of receiving an input and providing a corresponding output amplified by an amount corresponding to a gain feedback 497. Based upon the disclosure provided herein, one of ordinary skill in the art will recognize various amplifier circuits that may be used in relation to different embodiments of the present invention.

The output of variable gain amplifier circuit 415 is provided to an analog to digital converter circuit 420 that is operable to convert the analog signal received as the output from variable gain amplifier circuit 415 into a series of digital samples 425. Analog to digital converter circuit 420 may be any circuit known in the art that is capable of representing a received analog signal as digital values. Digital samples 425 are provided to an equalizer circuit 430 that equalizes the samples based at least in part on a number of coefficients, and provides an equalized output 432 to a data detector circuit 440. In some embodiments of the present invention, equalizer circuit 430 is a digital finite impulse response filter (DFIR) as are known in the art. Data detector circuit 440 may be any circuit known in the art that is capable of performing a data detection process. As one example, data detector circuit 440 may include one or more of a maximum a posteriori data detection circuit and a low density parity check decoder as are known in the art. In other cases, data detector circuit 440 may include one or more of a Viterbi algorithm data detection circuit and a low density parity check decoder as are known in the art. Data detector circuit 440 operates based on a number of target taps 435. Target taps 435 may be user selected or adaptable depending upon the particular design. Based upon the disclosure provided herein, one of ordinary skill in the art will recognize other data detector circuits that may be used in relation to different embodiments of the present invention. Data detector circuit 440 provides a data output 410.

A digital phase shifting circuit 450 receives digital samples 425 and determines a peak value 455 based on digital samples 425. In some instances, digital samples 425 represent a 2T synchronization pattern that when sampled yields a repeating sinusoidal pattern. In some such cases, phase shifting circuit 450 may be implemented as a digital interpolation circuit that is operable interpolate the received digital samples and based thereon to calculate the maximum value of the repeating sinusoidal pattern. Based on the disclosure provided herein, one of ordinary skill in the art will recognize a variety of circuits capable of determining a peak value of data input 405 that may be used in relation to different embodiments of the present invention.

Peak value 455 is provided to an absolute value calculation circuit 460 that provides the positive magnitude of peak value 455 to a summation circuit 465. The output of Absolute value calculation circuit 460 is represented as:

Output=|Peak Value 455|.

Summation circuit 465 subtracts an expected value 470 from the magnitude of peak value 455 to yield a interim value 467 that is provided to a multiplication circuit 475 and a multiplication circuit 480. Difference value 467 is represented as:

Interim Value 467=|Peak Value 455|−Expected Value 470.

Multiplication circuit 475 multiplies peak value 455 by interim value 467 to yield a least mean square error value 490. Least mean square error value 490 is represented as:

Least Mean Square Error 490=(Peak Value 455)(|Peak Value 455|−Expected Value 470).

Multiplication circuit 480 multiplies expected value 470 by interim value 467 to yield zero forcing error value 485. Zero forcing error value 485 is represented as:

Zero Forcing Error 485=(Ideal Value 470)(|Peak Value 455|−Expected Value 470).

A Nyquist energy calculation circuit and hybrid gain feedback combination circuit 495 calculates the Nyquist energy of the target implemented by data detector circuit 440. In one particular example, the target is implemented by three target taps 435 (T1, T2, T3). The energy is calculated based upon the three filter taps in accordance with the following equation:

Energy=absolute value[$T2-(T1+T3)$].

The aforementioned energy value is then used to selectively combine zero forcing error 485 and least mean square error 490 to yield gain feedback 497. In some cases, gain feedback 497 is a weighted combination of least mean square error 490 to yield gain feedback 497, with the weighting based upon the aforementioned energy value. In some embodiments of the present invention, gain feedback 497 is determined in accordance with the following pseudo-code:

```
If (Energy >= ValueA)
{
    Gain Feedback 497 = Least Mean Square Error 490
}
Else If (Energy < ValueA && Energy >= ValueB)
{
    Gain Feedback 497 = (1/4)(Zero Forcing Error 485) +
    (3/4)( Least Mean Square Error 490)
}
Else If (Energy < ValueB && Energy >= ValueC)
{
    Gain Feedback 497 = (1/2)(Zero Forcing Error 485) +
    (1/2)( Least Mean Square Error 490)
}
Else If (Energy < ValueC && Energy >= ValueD)
{
    Gain Feedback 497 = (3/4)(Zero Forcing Error 485) +
    (1/4)( Least Mean Square Error 490)
}
Else
{
    Gain Feedback 497 = Zero Forcing Error 485
}
```

In one particular embodiment of the present invention, ValueA is six (6), ValueB is five (5), ValueC is four (4), and ValueD is three (3). Based upon the disclosure provided herein, one of ordinary skill in the art will recognize other hybrid combinations of Zero Forcing Error 485 and Least Mean Square Error 490 and/or values (i.e., ValueA, ValueB, ValueC or ValueD) that may be used in relation to different embodiments of the present invention. Again, gain feedback 497 is provided as an input to control the amplification applied by variable gain amplifier 415.

Figure 5:
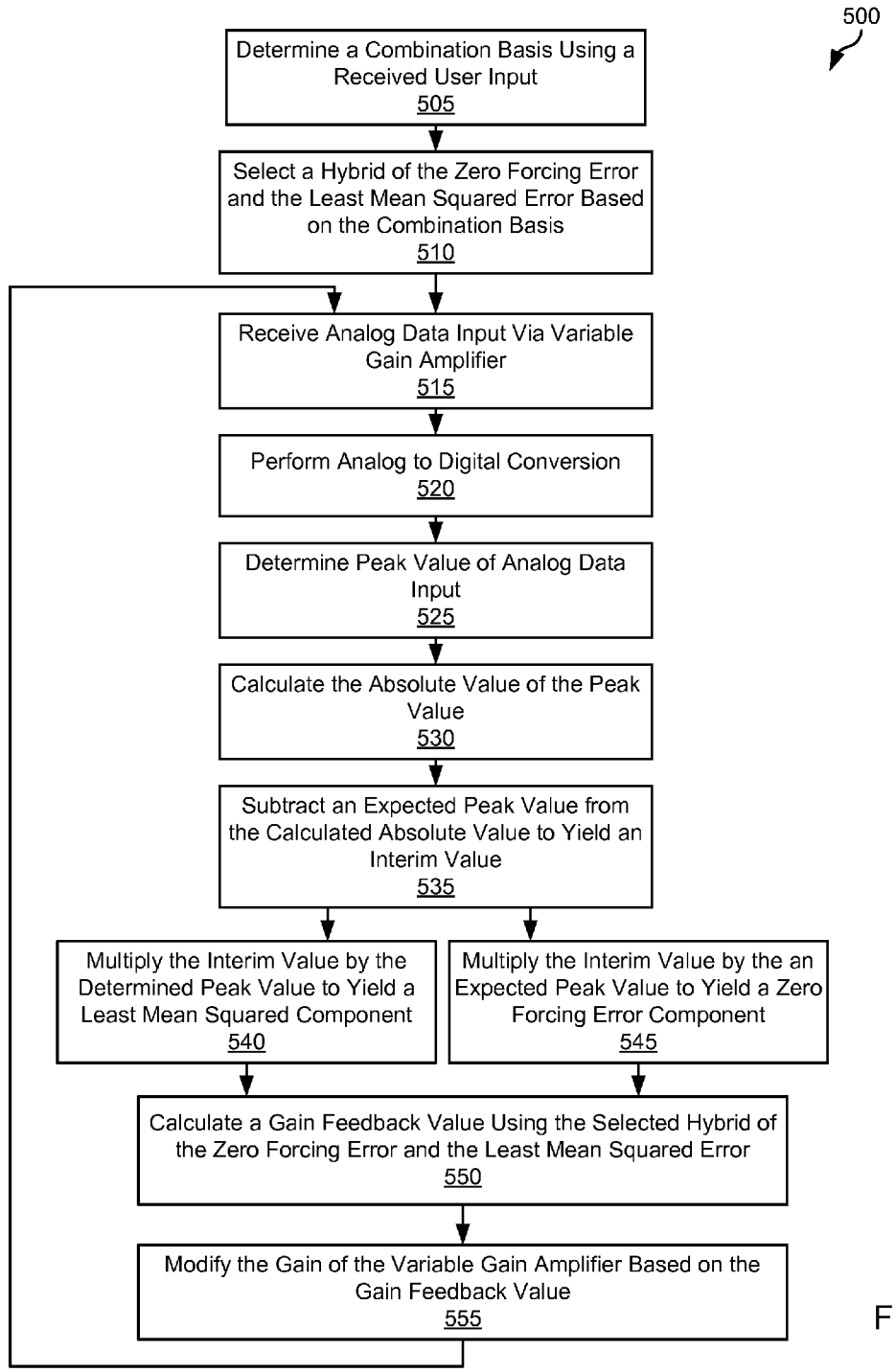
FIG. 5 is a flow diagram showing a method for variable gain processing of data in accordance with some embodiments of the present invention.

Turning to FIG. 5, a flow diagram 500 shows a method for variable gain processing of data in accordance with some embodiments of the present invention. Following flow diagram 500, a combination basis is determined using a user received input (block 505). The combination basis defines the component parts of a hybrid gain control value. In some embodiments of the present invention, the combination basis is calculated as an energy value derived from user provided partial response target values used in a partial response target circuit of an included data processing circuit. In one particular embodiment of the present invention, the partial response target circuit uses a three tap input (T1, T2, T3), and the energy value is calculated in accordance with the following equation:

Energy=absolute value[$T2-(T1+T3)$].

Based upon the determined combination basis (block 505), a hybrid of the output of two or more gain algorithms is selected (block 510). In some embodiments, the hybrid value (i.e., gain feedback) is a combination of the output of a zero forcing gain algorithm (i.e., a zero forcing error) and the output of a least mean squared gain algorithm (i.e., a least mean squared error). In one particular case, the gain feedback is determined in accordance with the following pseudo-code:

```
If (Combination Basis >= ValueA)
{
    Gain Feedback = Least Mean Square Error
}
Else If (Combination Basis < ValueA && Energy >= ValueB)
{
    Gain Feedback = (1/4)(Zero Forcing Error) + (3/4)
    ( Least Mean Square Error)
}
```

-continued

```
Else If (Combination Basis < ValueB && Energy >= ValueC)
{
    Gain Feedback = (1/2)(Zero Forcing Error) + (1/2)
    ( Least Mean Square Error)
}
Else If (Combination Basis < ValueC && Energy >= ValueD)
{
    Gain Feedback = (3/4)(Zero Forcing Error) + (1/4)
    ( Least Mean Square Error)
}
Else
{
    Gain Feedback = Zero Forcing Error
}
```

In one particular case where the combination basis is calculated using the aforementioned three tap input of a partial response target circuit, ValueA is six (6), ValueB is five (5), ValueC is four (4), and ValueD is three (3). Based upon the disclosure provided herein, one of ordinary skill in the art will recognize other hybrid combinations of a zero forcing error and a least mean square error and/or values (i.e., ValueA, ValueB, ValueC or ValueD) that may be used in relation to different embodiments of the present invention.

An analog data input is received as an input to a variable gain amplifier (block 515) that provides an amplified analog output. The amplified analog output is provided to an analog to digital converter that provides a series of digital samples representing the amplified analog output from the variable gain amplifier (block 520). The series of digital samples are processed to determine the peak value of the amplified analog output (block 525). In one particular case, the amplified analog output approximates a sinusoidal wave form derived from a periodic pattern of synchronization data, and processing the series of digital samples includes performing a digital interpolation of the series of digital samples to calculate the peak value of the sinusoidal waveform. An absolute value of the aforementioned peak value is calculated by changing any negative sign to a positive sign (block 530), and an expected peak value is subtracted from the aforementioned absolute value to yield an interim value (block 535). The expected peak value may be programmed based upon an understanding of the synchronization information included in the received analog data input. This interim value is a rough representation of the error in the gain applied by the variable gain amplifier, and is represented by the following equation:

$$\text{Interim Value} = |\text{Peak Value}| - \text{Ideal Value } 470$$

The interim value is multiplied by the previously determined peak value to yield a least mean squared error component (block 540). The least mean square error component is represented by the following equation:

$$\text{Least Mean Square Error Component} = (\text{Peak Value})(|\text{Peak Value}| - \text{Expected Value}).$$

In parallel, the interim value is multiplied by the previously ideal value to yield a zero forcing error component (block 545). The zero forcing error component is represented by the following equation:

$$\text{Zero Forcing Error Component} = (\text{Ideal Value})(|\text{Peak Value}| - \text{Ideal Value}).$$

It should be noted that other algorithms may be used to yield error components.

The previously selected hybrid of the output of two or more gain algorithms is used to calculate a gain feedback value using the previously calculated error components (block 550). In one particular case, the aforementioned least mean square error component and zero forcing error component are combined in accordance with the pseudo-code discussed above in relation to block 510. The resulting gain feedback is provided as an input to the variable gain amplifier (block 555).

In conclusion, the invention provides novel systems, devices, methods and arrangements for determining gain settings. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A data processing circuit, the data processing circuit comprising:
    a variable gain amplifier operable to apply a gain to a data input corresponding to a gain feedback value and providing an amplified output;
    a gain circuit operable to calculate a first algorithm error component and a second algorithm error component based at least in part on the amplified output; and
    a hybrid gain feedback combination circuit operable combine the first algorithm error component and the second algorithm error component to yield the gain feedback value when the data input includes a synchronization pattern.

2. The data processing circuit of claim 1, wherein the first algorithm error component is a zero forcing error value, and wherein the second algorithm error component is a least mean squared error component.

3. The data processing circuit of claim 2, wherein the gain circuit is operable to determine a peak value of the amplified output, and to calculate a difference between the peak value of the amplified output and an expected value of the amplified output to yield an interim value.

4. The data processing circuit of claim 3, wherein calculating the zero forcing error value is done by multiplying the interim value by the expected value of the amplified output.

5. The data processing circuit of claim 3, wherein calculating the least mean squared error value is done by multiplying the interim value by the peak value of the amplified output.

6. The data processing circuit of claim 1, wherein the hybrid gain feedback combination circuit is operable to add the first algorithm error component multiplied by a first weighting factor to the second algorithm error component multiplied by a second weighting factor.

7. The data processing circuit of claim 6, wherein the first weighting factor is the same as the second weighting factor.

8. The data processing circuit of claim 6, wherein the first weighting factor is distinct from the second weighting factor.

9. The data processing circuit of claim 8, wherein one of the first weighting factor and the second weighting factor is zero.

10. The data processing circuit of claim 1, wherein the gain circuit is a first gain circuit, and wherein the data processing circuit further comprises:
    a second gain circuit operable to calculate a third algorithm error component and a fourth algorithm error component based at least in part on the amplified output; and
    wherein the hybrid gain feedback combination circuit is operable combine the third algorithm error component and the fourth algorithm error component to yield the gain feedback value when the data input includes a user data pattern.

11. The data processing circuit of claim 10, wherein the first algorithm error component is a first zero forcing error value, wherein the second algorithm error component is a first least mean squared error component, wherein the third algorithm error component is a second zero forcing error value, and wherein the fourth algorithm error component is a second least mean squared error component.

12. The data processing circuit of claim 10, wherein the hybrid gain feedback combination circuit is operable to add the first algorithm error component multiplied by a first weighting factor to the second algorithm error component multiplied by a second weighting factor when the data input includes the synchronization pattern, and wherein the hybrid gain feedback combination circuit is operable to add the third algorithm error component multiplied by the first weighting factor to the fourth algorithm error component multiplied by the second weighting factor when the data input includes a user data pattern.

13. The data processing circuit of claim 1, wherein the data processing circuit is implemented as part of a system selected from a group consisting of: a storage system and a communication system.

14. An electronic device, the electronic device comprising:
a variable gain amplifier operable to apply a gain to a data input corresponding to a gain feedback value and providing an amplified output;
a first gain circuit operable to calculate a first algorithm error component and a second algorithm error component based at least in part on the amplified output;
a second gain circuit operable to calculate a third algorithm error component and a fourth algorithm error component based at least in part on the amplified output; and
a hybrid gain feedback combination circuit operable combine the first algorithm error component and the second algorithm error component to yield a gain feedback value when the data input includes a synchronization pattern, and to combine the third algorithm error component and the fourth algorithm error component to yield the gain feedback value when the data input includes a user data pattern.

15. The electronic device of claim 14, wherein the first algorithm error component is a first zero forcing error value, wherein the second algorithm error component is a first least mean squared error component, wherein the third algorithm error component is a second zero forcing error value, and wherein the fourth algorithm error component is a second least mean squared error component.

16. The electronic device of claim 14, wherein the hybrid gain feedback combination circuit is operable to add the first algorithm error component multiplied by a first weighting factor to the second algorithm error component multiplied by a second weighting factor when the data input includes the synchronization pattern, and wherein the hybrid gain feedback combination circuit is operable to add the third algorithm error component multiplied by the first weighting factor to the fourth algorithm error component multiplied by the second weighting factor when the data input includes a user data pattern.

17. The electronic device of claim 14, wherein the electronic device is selected from a group consisting of: a storage device and a communication device.

18. A method for performing variable gain amplification in a data processing system, the method comprising:
receiving a data input exhibiting a synchronization pattern;
applying a variable gain amplification to the data input to yield an amplified output, wherein the variable gain is governed at least in part by the gain feedback;
calculating a zero forcing error value and a second algorithm error value corresponding to the amplified output; and
calculating the gain feedback based on a hybrid combination of the zero forcing error value and the least mean squared error value.

19. The method of claim 18, wherein the method further comprises:
determining a peak value of the amplified output;
calculating a difference between the peak value of the amplified output and an expected value of the amplified output;
wherein calculating the zero forcing error value includes multiplying the peak value by the difference; and
wherein calculating the least mean squared error value includes multiplying the expected value by the difference.

20. The method of claim 18, wherein the method further comprises:
determining a combination basis using a programmed input; and
selecting the hybrid combination of the zero forcing error value and the least mean squared error value to calculate a gain feedback based at least in part on the combination basis.

* * * * *